(12) United States Patent
Doll

(10) Patent No.: US 8,472,181 B2
(45) Date of Patent: Jun. 25, 2013

(54) COMPUTER CABINETS HAVING PROGRESSIVE AIR VELOCITY COOLING SYSTEMS AND ASSOCIATED METHODS OF MANUFACTURE AND USE

(75) Inventor: Wade J. Doll, Seattle, WA (US)

(73) Assignee: Cray Inc., Seattle, WA (US)

( * ) Notice: Subject to any disclaimer, the term of this patent is extended or adjusted under 35 U.S.C. 154(b) by 121 days.

(21) Appl. No.: 12/763,977

(22) Filed: Apr. 20, 2010

(65) Prior Publication Data

US 2011/0255237 A1  Oct. 20, 2011

(51) Int. Cl.
*H05K 7/20* (2006.01)

(52) U.S. Cl.
USPC ........... 361/679.49; 361/679.51; 361/695; 361/730; 361/752; 62/259.2; 62/441; 454/184

(58) Field of Classification Search
USPC ....... 361/676–678, 679.46–679.51, 688–695, 361/701–704, 707, 709–710, 715–721, 730, 361/752
See application file for complete search history.

(56) References Cited

U.S. PATENT DOCUMENTS

| | | | |
|---|---|---|---|
| 2,628,018 A | 2/1953 | Koch | |
| 2,673,721 A | 3/1954 | Dickinson | |
| 2,861,782 A | 11/1958 | Swartz | |
| 3,120,166 A | 2/1964 | Lyman | |
| 3,192,306 A | 6/1965 | Skonnord | |
| 3,236,296 A | 2/1966 | Dubin | |
| 3,317,798 A | 5/1967 | Chu et al. | |
| 3,348,609 A | 10/1967 | Dubin et al. | |
| 3,525,385 A | 8/1970 | Liebert | |
| 3,559,728 A | 2/1971 | Lyman et al. | |
| 3,648,754 A | 3/1972 | Sephton | |
| 3,903,404 A | 9/1975 | Beall et al. | |
| 3,942,426 A | 3/1976 | Binks et al. | |
| 4,016,357 A | 4/1977 | Abrahamsen | |
| 4,158,875 A | 6/1979 | Tajima et al. | |
| 4,261,519 A | 4/1981 | Ester | |
| 4,270,362 A | 6/1981 | Lancia et al. | |
| 4,271,678 A | 6/1981 | Liebert | |
| 4,306,613 A | 12/1981 | Christopher | |

(Continued)

FOREIGN PATENT DOCUMENTS

| JP | 2197195 A | 8/1990 |
|---|---|---|
| JP | 07-030275 A | 1/1995 |

(Continued)

OTHER PUBLICATIONS

Baer, D.B., "Emerging Cooling Requirements & Systems in Telecommunications Spaces," Telecommunications Energy Conference 2001, Oct. 14-18, 2001, pp. 95-100.

(Continued)

*Primary Examiner* — Courtney Smith
(74) *Attorney, Agent, or Firm* — Perkins Coie LLP

(57) ABSTRACT

Computer cabinets, such as supercomputer cabinets, having progressive air velocity cooling systems are described herein. In one embodiment, a computer cabinet includes an air mover positioned beneath a plurality of computer module compartments. The computer module compartments can be arranged in tiers with the computer modules in each successive tier being positioned closer together than the computer modules in the tier directly below. The computer cabinet can also include one or more shrouds, flow restrictors, and/or sidewalls that further control the direction and/or speed of the cooling air flow through the cabinet.

9 Claims, 10 Drawing Sheets

U.S. PATENT DOCUMENTS

| | | | |
|---|---|---|---|
| 4,313,310 A | 2/1982 | Kobayashi et al. |
| 4,315,300 A | 2/1982 | Parmerlee et al. |
| 4,386,651 A | 6/1983 | Reinhard |
| 4,449,579 A | 5/1984 | Miyazaki et al. |
| 4,458,296 A | 7/1984 | Bryant et al. |
| 4,473,382 A | 9/1984 | Cheslock |
| 4,513,351 A | 4/1985 | Davis et al. |
| 4,528,614 A | 7/1985 | Shariff et al. |
| 4,535,386 A | 8/1985 | Frey, Jr. et al. |
| 4,600,050 A | 7/1986 | Noren |
| 4,642,715 A | 2/1987 | Ende |
| 4,644,443 A | 2/1987 | Swensen et al. |
| 4,691,274 A | 9/1987 | Matouk et al. |
| 4,702,154 A | 10/1987 | Dodson |
| 4,728,160 A | 3/1988 | Mondor et al. |
| 4,767,262 A | 8/1988 | Simon |
| 4,774,631 A | 9/1988 | Okuyama et al. |
| 4,797,783 A | 1/1989 | Kohmoto et al. |
| 4,798,238 A | 1/1989 | Ghiraldi |
| 4,802,060 A | 1/1989 | Immel |
| 4,860,163 A | 8/1989 | Sarath |
| 4,874,127 A | 10/1989 | Collier |
| 4,901,200 A | 2/1990 | Mazura |
| 4,911,231 A | 3/1990 | Horne et al. |
| 4,993,482 A | 2/1991 | Dolbear et al. |
| 5,000,079 A | 3/1991 | Mardis |
| 5,019,880 A | 5/1991 | Higgins, III |
| 5,035,628 A | 7/1991 | Casciotti et al. |
| 5,060,716 A | 10/1991 | Heine |
| 5,090,476 A | 2/1992 | Immel |
| 5,101,320 A | 3/1992 | Bhargava et al. |
| 5,131,233 A | 7/1992 | Cray et al. |
| 5,150,277 A | 9/1992 | Bainbridge et al. |
| 5,161,087 A | 11/1992 | Frankeny et al. |
| 5,165,466 A | 11/1992 | Arbabian |
| 5,168,925 A | 12/1992 | Suzumura et al. |
| 5,196,989 A | 3/1993 | Zsolnay |
| 5,263,538 A | 11/1993 | Amidieu et al. |
| 5,273,438 A | 12/1993 | Bradley et al. |
| 5,297,990 A | 3/1994 | Renz et al. |
| 5,323,847 A | 6/1994 | Koizumi et al. |
| 5,326,317 A | 7/1994 | Ishizu et al. |
| 5,329,425 A | 7/1994 | Leyssens et al. |
| 5,339,214 A | 8/1994 | Nelson |
| 5,345,779 A | 9/1994 | Feeney |
| 5,365,402 A | 11/1994 | Hatada et al. |
| 5,376,008 A | 12/1994 | Rodriguez |
| 5,395,251 A | 3/1995 | Rodriguez et al. |
| 5,402,313 A | 3/1995 | Casperson et al. |
| 5,410,448 A | 4/1995 | Barker, III et al. |
| 5,414,591 A | 5/1995 | Kimura et al. |
| 5,467,250 A | 11/1995 | Howard et al. |
| 5,467,609 A | 11/1995 | Feeney |
| 5,471,850 A | 12/1995 | Cowans |
| 5,491,310 A | 2/1996 | Jen |
| 5,493,474 A | 2/1996 | Schkrohowsky et al. |
| 5,547,272 A | 8/1996 | Paterson et al. |
| 5,570,740 A | 11/1996 | Flores et al. |
| 5,572,403 A | 11/1996 | Mills |
| 5,603,375 A | 2/1997 | Salt |
| 5,603,376 A | 2/1997 | Hendrix |
| 5,684,671 A | 11/1997 | Hobbs et al. |
| 5,685,363 A | 11/1997 | Orihira et al. |
| 5,707,205 A | 1/1998 | Otsuka et al. |
| 5,709,100 A | 1/1998 | Baer et al. |
| 5,718,628 A | 2/1998 | Nakazato et al. |
| 5,749,702 A | 5/1998 | Datta et al. |
| 5,782,546 A | 7/1998 | Iwatare |
| 5,793,610 A | 8/1998 | Schmitt et al. |
| 5,829,676 A | 11/1998 | Ban et al. |
| 5,849,076 A | 12/1998 | Gaylord et al. |
| 5,880,931 A | 3/1999 | Tilton et al. |
| 5,927,386 A | 7/1999 | Lin |
| 5,979,541 A | 11/1999 | Saito et al. |
| 6,021,047 A | 2/2000 | Lopez et al. |
| 6,024,165 A | 2/2000 | Melane et al. |
| 6,026,565 A | 2/2000 | Giannatto et al. |
| 6,034,870 A | 3/2000 | Osborn et al. |
| 6,039,414 A | 3/2000 | Melane et al. |
| 6,046,908 A | 4/2000 | Feng |
| 6,052,278 A | 4/2000 | Tanzer et al. |
| 6,104,608 A | 8/2000 | Casinelli et al. |
| 6,115,242 A | 9/2000 | Lambrecht |
| 6,132,171 A | 10/2000 | Fujinaka et al. |
| 6,135,875 A | 10/2000 | French |
| 6,158,502 A | 12/2000 | Thomas |
| 6,164,369 A | 12/2000 | Stoller |
| 6,167,948 B1 | 1/2001 | Thomas |
| 6,182,787 B1 | 2/2001 | Kraft et al. |
| 6,183,196 B1 | 2/2001 | Fujinaka |
| 6,185,098 B1 | 2/2001 | Benavides |
| 6,205,796 B1 | 3/2001 | Chu et al. |
| 6,208,510 B1 | 3/2001 | Trudeau et al. |
| 6,236,564 B1 | 5/2001 | Fan |
| 6,272,012 B1 | 8/2001 | Medin et al. |
| 6,305,180 B1 | 10/2001 | Miller et al. |
| 6,310,773 B1 | 10/2001 | Yusuf et al. |
| 6,328,100 B1 | 12/2001 | Haussmann |
| 6,332,946 B1 | 12/2001 | Emmett et al. |
| 6,351,381 B1 | 2/2002 | Bilski et al. |
| 6,359,779 B1 | 3/2002 | Frank, Jr. et al. |
| 6,361,892 B1 | 3/2002 | Ruhl et al. |
| 6,396,684 B2 | 5/2002 | Lee |
| 6,416,330 B1 | 7/2002 | Yatskov et al. |
| 6,435,266 B1 | 8/2002 | Wu |
| 6,439,340 B1 | 8/2002 | Shirvan |
| 6,462,944 B1 | 10/2002 | Lin |
| 6,481,527 B1 | 11/2002 | French et al. |
| 6,501,652 B2 | 12/2002 | Katsui |
| 6,515,862 B1 | 2/2003 | Wong et al. |
| 6,519,955 B2 | 2/2003 | Marsala |
| 6,524,064 B2 | 2/2003 | Chou et al. |
| 6,536,510 B2 | 3/2003 | Khrustalev et al. |
| 6,542,362 B2 | 4/2003 | Lajara et al. |
| 6,546,998 B2 | 4/2003 | Oh et al. |
| 6,550,530 B1 | 4/2003 | Bilski |
| 6,554,697 B1 | 4/2003 | Koplin |
| 6,557,357 B2 | 5/2003 | Spinazzola et al. |
| 6,557,624 B1 | 5/2003 | Stahl et al. |
| 6,564,571 B2 | 5/2003 | Feeney |
| 6,564,858 B1 | 5/2003 | Stahl et al. |
| 6,582,192 B2 | 6/2003 | Tseng et al. |
| 6,587,340 B2 | 7/2003 | Grouell et al. |
| 6,609,592 B2 | 8/2003 | Wilson |
| 6,621,698 B2 | 9/2003 | Chang |
| 6,628,520 B2 | 9/2003 | Patel et al. |
| 6,631,078 B2 | 10/2003 | Alcoe et al. |
| 6,644,384 B2 | 11/2003 | Stahl |
| 6,646,879 B2 | 11/2003 | Pautsch |
| 6,661,660 B2 | 12/2003 | Prasher et al. |
| 6,679,081 B2 | 1/2004 | Marsala |
| 6,684,457 B2 | 2/2004 | Holt |
| 6,690,576 B2 | 2/2004 | Clements et al. |
| 6,695,041 B2 | 2/2004 | Lai et al. |
| 6,705,625 B2 | 3/2004 | Holt et al. |
| 6,714,412 B1 | 3/2004 | Chu et al. |
| 6,724,617 B2 | 4/2004 | Amaike et al. |
| 6,725,912 B1 | 4/2004 | Moll et al. |
| 6,742,068 B2 | 5/2004 | Gallagher et al. |
| 6,742,583 B2 | 6/2004 | Tikka |
| 6,745,579 B2 | 6/2004 | Spinazzola et al. |
| 6,755,280 B2 | 6/2004 | Porte et al. |
| 6,761,212 B2 | 7/2004 | DiPaolo |
| 6,772,604 B2 | 8/2004 | Bash et al. |
| 6,775,137 B2 | 8/2004 | Chu et al. |
| 6,776,707 B2 | 8/2004 | Koplin |
| 6,789,613 B1 | 9/2004 | Ozaki et al. |
| 6,796,372 B2 | 9/2004 | Bear |
| 6,801,428 B2 | 10/2004 | Smith et al. |
| 6,819,563 B1 | 11/2004 | Chu et al. |
| 6,836,407 B2 | 12/2004 | Faneuf et al. |
| 6,854,287 B2 | 2/2005 | Patel et al. |
| 6,854,659 B2 | 2/2005 | Stahl et al. |
| 6,860,713 B2 | 3/2005 | Hoover |
| 6,867,966 B2 | 3/2005 | Smith et al. |
| 6,875,101 B1 | 4/2005 | Chien |
| 6,876,549 B2 | 4/2005 | Beitelmal et al. |

| | | |
|---|---|---|
| 6,881,898 B2 | 4/2005 | Baker et al. |
| 6,882,531 B2 | 4/2005 | Modica |
| 6,896,095 B2 | 5/2005 | Shah et al. |
| 6,904,968 B2 | 6/2005 | Beitelmal et al. |
| 6,909,611 B2 | 6/2005 | Smith et al. |
| 6,914,780 B1 | 7/2005 | Shanker et al. |
| 6,932,443 B1 | 8/2005 | Kaplan et al. |
| 6,952,667 B2 | 10/2005 | Kempe |
| 6,975,510 B1 | 12/2005 | Robbins et al. |
| 6,992,889 B1 | 1/2006 | Kashiwagi et al. |
| 6,997,245 B2 | 2/2006 | Lindemuth et al. |
| 6,997,741 B2 | 2/2006 | Doll et al. |
| 6,999,316 B2 | 2/2006 | Hamman |
| 7,016,191 B2 | 3/2006 | Miyamoto et al. |
| 7,051,802 B2 | 5/2006 | Baer |
| 7,051,946 B2 | 5/2006 | Bash et al. |
| 7,059,899 B2 | 6/2006 | Doll et al. |
| 7,114,555 B2 | 10/2006 | Patel et al. |
| 7,120,017 B2 | 10/2006 | Shieh |
| 7,120,027 B2 | 10/2006 | Yatskov et al. |
| 7,123,477 B2 | 10/2006 | Coglitore et al. |
| 7,133,285 B2 | 11/2006 | Nishimura |
| 7,144,320 B2 | 12/2006 | Turek et al. |
| 7,152,418 B2 | 12/2006 | Alappat et al. |
| 7,154,748 B2 | 12/2006 | Yamada |
| 7,177,156 B2 | 2/2007 | Yatskov et al. |
| 7,182,208 B2 | 2/2007 | Tachibana |
| 7,185,696 B2 | 3/2007 | Schaper |
| 7,187,549 B2 | 3/2007 | Teneketges et al. |
| 7,193,846 B1 | 3/2007 | Davis et al. |
| 7,193,851 B2 | 3/2007 | Yatskov |
| 7,209,351 B2 | 4/2007 | Wei |
| 7,215,552 B2 | 5/2007 | Shipley et al. |
| 7,218,516 B2 | 5/2007 | Yu et al. |
| 7,222,660 B2 | 5/2007 | Giacoma et al. |
| 7,226,353 B2 | 6/2007 | Bettridge et al. |
| 7,227,751 B2 | 6/2007 | Robbins et al. |
| 7,242,579 B2 | 7/2007 | Fernandez et al. |
| 7,255,640 B2 | 8/2007 | Aldag et al. |
| 7,259,963 B2 | 8/2007 | Germagian et al. |
| 7,286,351 B2 | 10/2007 | Campbell et al. |
| 7,304,842 B2 | 12/2007 | Yatskov |
| 7,312,985 B2 | 12/2007 | Lee et al. |
| 7,314,113 B2 | 1/2008 | Doll |
| 7,315,448 B1 | 1/2008 | Bash et al. |
| 7,330,350 B2 | 2/2008 | Hellriegel et al. |
| 7,362,571 B2 | 4/2008 | Kelley et al. |
| 7,365,976 B2 * | 4/2008 | Fujiya et al. ............ 361/695 |
| 7,367,384 B2 | 5/2008 | Madara et al. |
| 7,382,613 B2 * | 6/2008 | Vinson et al. ............ 361/679.48 |
| 7,385,810 B2 | 6/2008 | Chu et al. |
| 7,397,661 B2 | 7/2008 | Campbell et al. |
| 7,411,785 B2 | 8/2008 | Doll |
| 7,418,825 B1 | 9/2008 | Bean, Jr. |
| 7,420,805 B2 | 9/2008 | Smith et al. |
| 7,430,118 B1 | 9/2008 | Noteboom et al. |
| 7,508,663 B2 | 3/2009 | Coglitore |
| 7,513,923 B1 | 4/2009 | Lewis et al. |
| 7,534,167 B2 | 5/2009 | Day |
| 7,542,287 B2 | 6/2009 | Lewis, II et al. |
| 7,554,803 B2 | 6/2009 | Artman et al. |
| 7,630,198 B2 | 12/2009 | Doll |
| 7,641,101 B2 | 1/2010 | Campbell et al. |
| 7,657,347 B2 | 2/2010 | Campbell et al. |
| 7,679,909 B2 | 3/2010 | Spearing et al. |
| 7,707,880 B2 | 5/2010 | Campbell et al. |
| 7,710,720 B2 | 5/2010 | Fuke et al. |
| 7,830,658 B2 | 11/2010 | Van Andel |
| 7,895,854 B2 | 3/2011 | Bash et al. |
| 2002/0072809 A1 | 6/2002 | Zuraw |
| 2003/0053928 A1 | 3/2003 | Takano |
| 2004/0008491 A1 | 1/2004 | Chen |
| 2004/0020225 A1 | 2/2004 | Patel et al. |
| 2004/0052052 A1 | 3/2004 | Rivera |
| 2004/0264131 A1 * | 12/2004 | Nishiyama et al. ............ 361/694 |
| 2005/0120737 A1 | 6/2005 | Borror et al. |
| 2005/0161205 A1 | 7/2005 | Ashe et al. |
| 2005/0186070 A1 | 8/2005 | Zeng et al. |
| 2005/0207116 A1 | 9/2005 | Yatskov et al. |
| 2005/0217837 A1 | 10/2005 | Kudija |
| 2005/0241810 A1 | 11/2005 | Malone et al. |
| 2006/0044758 A1 | 3/2006 | Spangberg |
| 2006/0102322 A1 * | 5/2006 | Madara et al. ............ 165/104.21 |
| 2006/0180301 A1 | 8/2006 | Baer |
| 2007/0030650 A1 | 2/2007 | Madara et al. |
| 2007/0224084 A1 | 9/2007 | Holmes et al. |
| 2008/0078202 A1 | 4/2008 | Luo |
| 2008/0098763 A1 | 5/2008 | Yamaoka |
| 2008/0112128 A1 | 5/2008 | Holland |
| 2008/0158814 A1 | 7/2008 | Hattori |
| 2008/0212282 A1 * | 9/2008 | Hall et al. ............ 361/701 |
| 2008/0216493 A1 | 9/2008 | Lin et al. |
| 2009/0154091 A1 | 6/2009 | Yatskov |
| 2009/0201644 A1 | 8/2009 | Kelley et al. |
| 2009/0236006 A1 | 9/2009 | Farese et al. |
| 2009/0244826 A1 * | 10/2009 | Doll ............ 361/679.46 |
| 2009/0260384 A1 | 10/2009 | Champion et al. |
| 2010/0097751 A1 | 4/2010 | Doll et al. |
| 2010/0097752 A1 * | 4/2010 | Doll et al. ............ 361/679.48 |
| 2011/0112694 A1 | 5/2011 | Bash et al. |

FOREIGN PATENT DOCUMENTS

| | | |
|---|---|---|
| JP | 2002026548 A | 1/2002 |
| JP | 2002237692 A | 8/2002 |
| JP | 2003227931 A | 8/2003 |
| JP | 2004079754 | 3/2004 |
| WO | WO-0186217 | 11/2001 |
| WO | WO-2005027609 | 3/2005 |

OTHER PUBLICATIONS

Bleier, F. P., "FAN Handbook, Selection, Application, and Design," McGraw Hill, 1998, pp. 7.50-7.51.

Hannemann, R. et al., "Pumped Liquid Multiphase Cooling," ASME, 2004, IMECE 2004, Paper IMECE2004-60669, Anaheim, CA, 5 pages.

JAMSTEC/Earth Simulator Center, "Processor Node (PN) Cabinet," http://www.es.jamstec.go.jp/esc/eng/Hardware/pnc.html, 1 page, [accessed Mar. 5, 2004].

Liebert Corporation, "Managing Extreme Heat Cooling Strategies for High-Density Computer Systems," Dec. 7, 2003, Columbus, OH, 16 pages.

Marsala, J., "Pumped Liquid/Two Phase Cooling for High Performance Systems," Thermal Form & Function LLC, May 13, 2003, Scottsdale, AZ, 19 pages.

Novel Concepts, Inc., "Heat Spreaders," http://www.novelconceptsinc.com/heat-spreaders.htm, 2 pages [accessed Jun. 14, 2004].

Pitasi, M. "Thermal Management System Using Pumped Liquid R-134a with Two Phase Heat Transfer," Thermal Form & Function LLC, Manchester, MA, Mar. 2002, pp. 1-9, http:/www.coolingzone.com/Guest/News/NL_MAR_2002/TFF/Tff.html.

Thermal Form & Function LLC, "Box/Blade Cooling System," http://www.thermalformandfunction.com/boxsystem.html, Manchester, MA, 2005, 1 page [accessed May 10, 2006].

Thermal Form & Function LLC, "Thermal Form & Function—Rack Cooling System (RCS)," 2005, Manchester, MA, one page, http://www.thermalformandfunction.com/racksystem.html, [accessed May 11, 2006].

Thermacore International, Inc., "Frequently Asked Questions about Heat Pipes," http://www.thermacore.com/hpt_faqs.htm, 3 pages [accessed Jun. 14, 2004].

Thermacore Thermal Management Solutions, "Therma-base-Heat Sink," 3 pages, [accessed Jun. 14, 2005].

Vogel, M. et al., "Low Profile Heat Sink Cooling Technologies for Next Generation CPU Thermal Designs," *Electronic Cooling Online*, Feb. 17, 2005, 11 pages.

Webb, W., "Take the heat: Cool that hot embedded design," *EDN*, May 13, 2004, 5 pages.

Final Office Action for U.S. Appl. No. 11/958,114, Mail Date Apr. 9, 2010, 28 pages.

Non-Final Office Action for U.S. Appl. No. 11/371,272, Mail Date Mar. 19, 2009, 13 pages.

Non-Final Office Action for U.S. Appl. No. 11/958,114, Mail Date Aug. 25, 2009, 22 pages.
Non-Final Office Action for U.S. Appl. No. 12/029,124, Mail Date Dec. 11, 2009, 27 pages.
Non-Final Office Action for U.S. Appl. No. 12/060,377, Mail Date Sep. 23, 2009, 10 pages.

Notice of Allowance for U.S. Appl. No. 12/029,124, Mail Date Oct. 28, 2011, 21 pages.
Japanese Office Action for Japanese Application No. 2011-083529, Mail Date Jul. 3, 2012, 3 pages.

* cited by examiner

COMPUTER CABINETS HAVING PROGRESSIVE AIR VELOCITY COOLING SYSTEMS AND ASSOCIATED METHODS OF MANUFACTURE AND USE

APPLICATION(S) INCORPORATED BY REFERENCE

U.S. patent application Ser. No. 12/060,377, filed Apr. 1, 2008, and entitled "AIRFLOW MANAGEMENT APPARATUS FOR COMPUTER CABINETS AND ASSOCIATED METHODS," is incorporated herein in its entirety by reference.

TECHNICAL FIELD

The following disclosure relates generally to systems and method for controlling air flow in computer cabinets, and to associated methods of manufacture and use.

BACKGROUND

Supercomputers and other large computer systems typically include a large number of computer cabinets positioned close together in rows to conserve floor space and reduce cable length. FIG. 1, for example, illustrates a portion of a prior art supercomputer system 100 having a plurality of computer cabinets 110 arranged in a bank. Each of the computer cabinets 110 includes a plurality of computer module compartments 118 (identified individually as a first module compartment 118a, a second module compartment 118b, and a third module compartment 118c). Each module compartment 118 holds a plurality of computer modules 112. Each of the computer modules 112 can include a motherboard electrically connecting a plurality of processors, memory modules, routers, and other microelectronic devices together for data and/or power transmission. Like the computer cabinets 110, the computer modules 112 are also positioned in close proximity to each other to conserve space and increase computational speed by reducing cable length.

Many of the electronic devices typically found in supercomputers, such as fast processing devices, generate considerable heat during operation. This heat can damage the device and/or degrade performance if not sufficiently dissipated during operation. For this reason, supercomputers typically include both active and passive cooling systems to maintain device temperatures at acceptable levels.

To dissipate heat during operation, a fan 120 is mounted to the upper portion of each of the computer cabinets 110. In operation, the individual fans 120 draw cooling air into the corresponding computer cabinet 110 through a front inlet 114 and/or a rear inlet 115 positioned toward a bottom portion of the computer cabinet 110. The fan 120 then draws the cooling air upwardly past the computer modules 112, into a central inlet 122, and out of the computer cabinet 110 in a radial pattern through a circumferential outlet 124.

The fans 120 may be unable to move a sufficient amount of air through the computer cabinet 110 for adequate cooling when the power consumption and heat generated by the processors and/or other microelectronic devices increases. For example, as the power consumption of the processors increases, the computer modules 112 in the first module compartment 118a heat the incoming cooling air to a higher temperature. To compensate for the higher temperature of the air entering the second module compartment 118b, conventional techniques use baffle plates (not shown) to direct more cooling air over the processors. This can increase the pressure drop over the processors, however, and the fans 120 may be unable to compensate for the pressure drop. As a result, the cooling air flowing past the processors may be insufficient and lead to overheating, which can adversely affect performance of the computer system 100.

DETAILED DESCRIPTION

Figure 1:
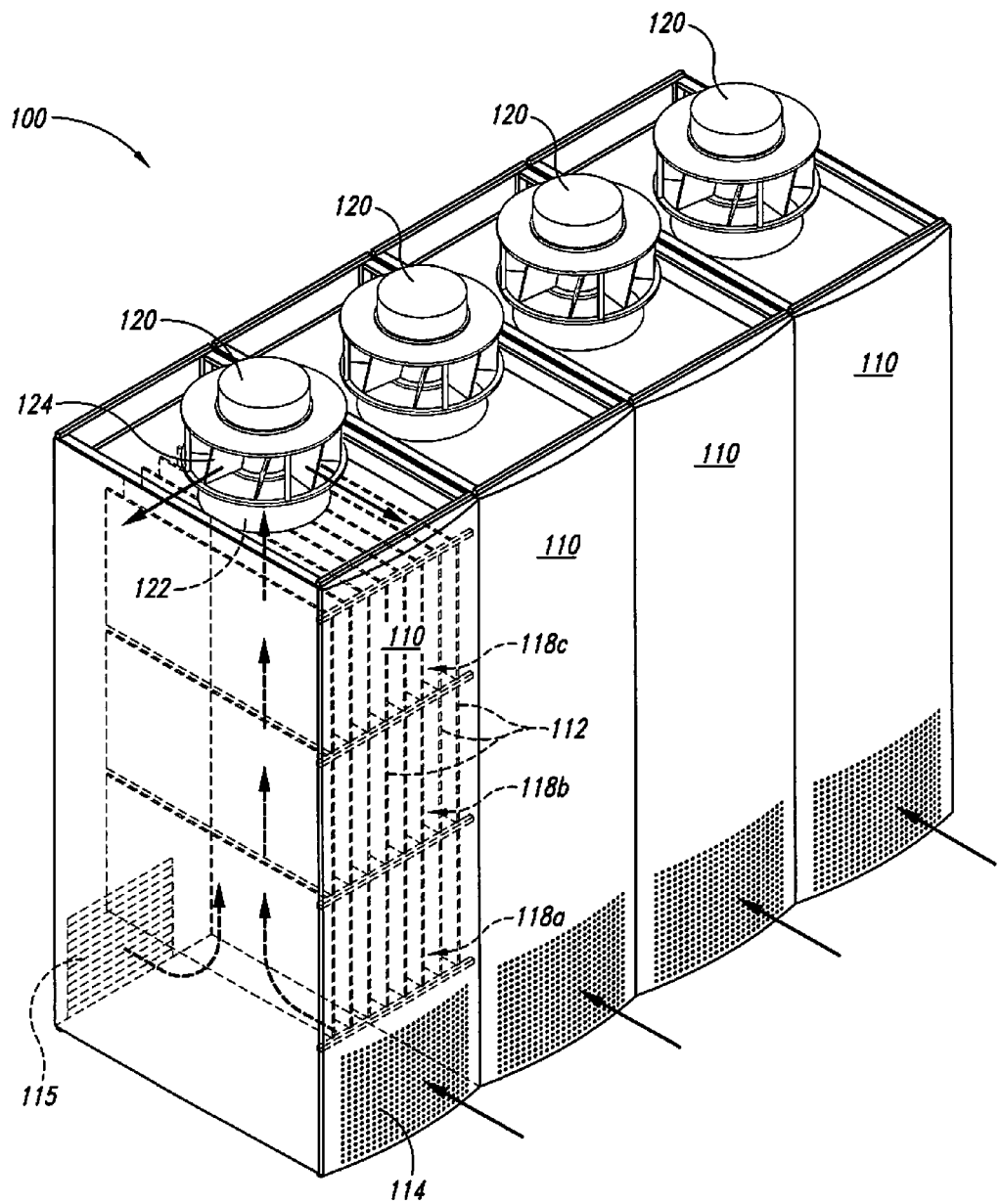
FIG. 1 is an isometric view of a bank of computer cabinets having top-mounted cooling fans in accordance with the prior art.

The present disclosure describes various embodiments of methods and systems for progressive air velocity cooling of electronic components in computer cabinets (e.g., tiered computer cabinets). Computer cabinets in supercomputers and other data centers can ingest relatively hot (e.g., 50° C. or higher) surrounding air for cooling in many global locations. Moreover, to reduce energy costs associated with operation in such locations, it is often desirable to operate the fans in the computer cabinets at a relatively low pressure and flow. These factors can lead to relatively high operating temperatures, and unfortunately many of the existing approaches to such free air cooling, such as liquid cooling at the cabinet or component level, air cooling with high flow rates, and/or air cooling with many fans or high powered fans, fall short in performance or are costly to implement.

In one embodiment of the present disclosure, the challenges associated with free air cooling are addressed by a vertical airflow computer cabinet in which the pitch or spacing between individual computer modules is decreased as the airflow progresses (e.g., upwardly) through the cabinet. This can increase the air stream velocity as the air progresses through the cabinet. The increased velocity increases the heat transfer coefficient of the air and offsets the elevated air temperature caused by the upstream electronic devices. Because high velocity is not needed near the upstream computer modules where the temperature of the entering air is relatively low, the pitch between the upstream computer modules can be larger than the downstream modules to reduce the air pressure drop associated with the upstream modules. Accordingly, computer cabinets configured in accordance with the present disclosure can be designed to provide increased airflow velocity only where needed.

In addition, shrouds and/or other structures configured in accordance with the present disclosure can be utilized to control the flow of cooling air through or around heat sinks and adjacent component "lanes" (e.g., memory lanes) to further "tune" and improve cooling efficiency. The various methods and systems described herein can increase the uniformity of device temperatures within a computer cabinet and reduce the necessary air pressure and flow rate required to cool such devices under relatively high ambient temperatures. Moreover, the methods and systems described herein can facilitate compact designs of computer cabinets, leading to relatively high density data centers and, accordingly, lower facility operating costs.

Certain details are set forth in the following description and in FIGS. 2-9B to provide a thorough understanding of various embodiments of the disclosure. Other details describing well-known structures and systems often associated with computer cabinets, computer components, cooling systems, etc. have not been set forth in the following disclosure to avoid unnecessarily obscuring the description of the various embodiments of the disclosure.

Many of the details, dimensions, angles and other features shown in the Figures are merely illustrative of particular embodiments of the disclosure. Accordingly, other embodiments can have other details, dimensions, angles and features without departing from the spirit or scope of the present invention. In addition, those of ordinary skill in the art will appreciate that further embodiments of the invention can be practiced without several of the details described below.

In the Figures, identical reference numbers identify identical, or at least generally similar, elements. To facilitate the discussion of any particular element, the most significant digit or digits of any reference number refers to the Figure in which that element is first introduced. For example, element 210 is first introduced and discussed with reference to FIG. 2.

Figure 2:
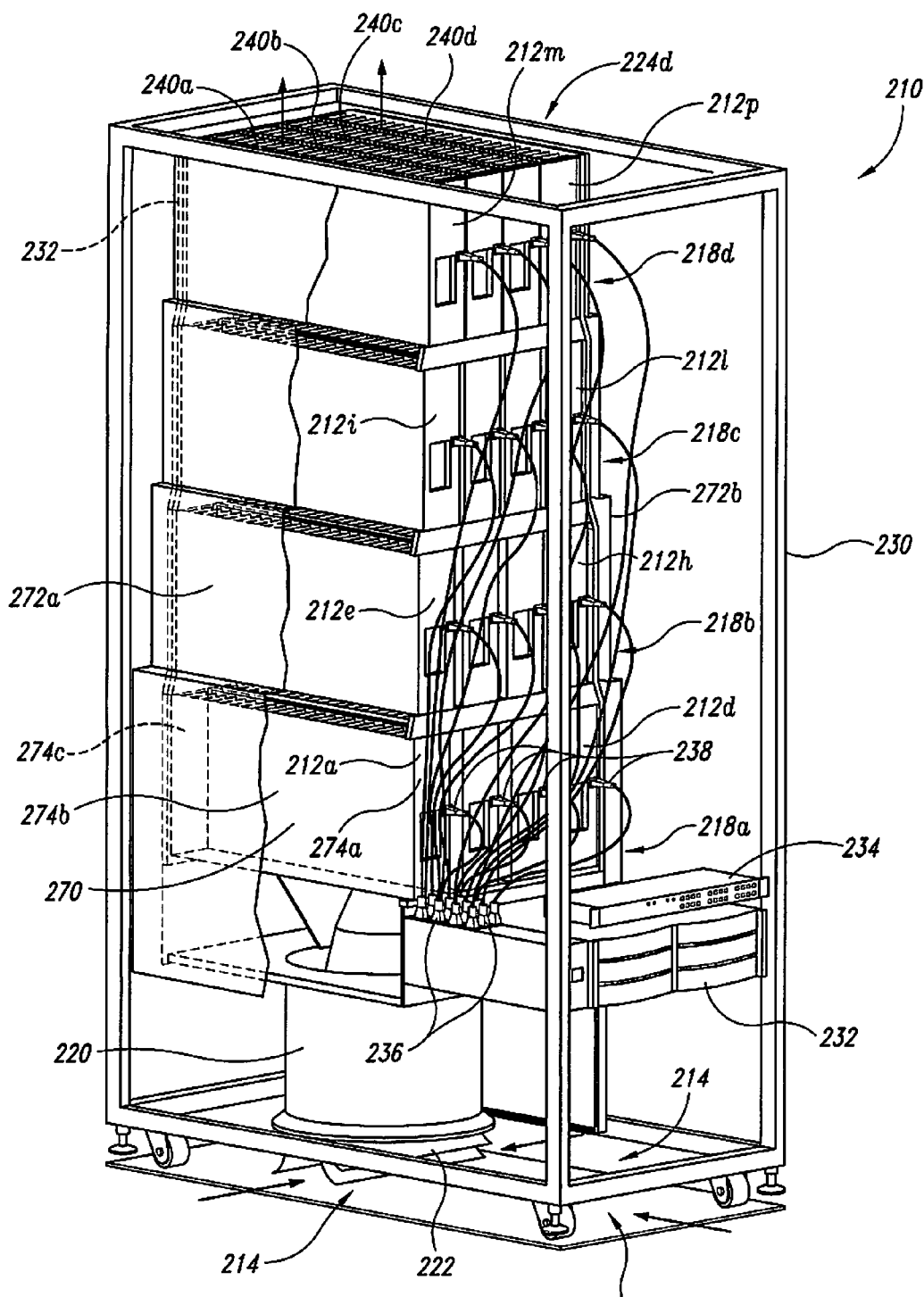
FIG. 2 is an isometric view of a computer cabinet configured in accordance with an embodiment of the disclosure.

FIG. 2 is an isometric view of a computer cabinet 210 having a progressive velocity cooling system configured in accordance with an embodiment of the disclosure. The computer cabinet 210 includes a chassis 230 housing a plurality of computer module compartments 218 (identified individually as a first computer module compartment 218a, a second computer module compartment 218b, a third computer module compartment 218c, and a fourth computer module compartment 218d). Each of the computer module compartments 218 carries a plurality of corresponding computer modules 212 positioned in edgewise orientation relative to the flow of cooling air moving upwardly through the chassis 230. For example, the first computer module compartment 218a carries computer modules 212a-212d, the second computer module compartment 218b carries computer modules 212e-212h, and so on.

The computer cabinet 210 can further include a plurality of network switches 234 and a power supply 232. The power supply 232 includes a plurality of outlet connectors 236 that provide electrical power to the individual computer modules 212 via a plurality of inlet connectors 238. In the illustrated embodiment, an individual shroud 270 is positioned around each of the computer modules 212. Each of the shrouds 270 can include a front panel 274a, a rear panel 274b, and a side panel 274c that cover a front, rear, and side portion, respectively, of the corresponding computer module 212. As described below, each of the computer modules 212 can further include a motherboard that serves as a cover for the remaining side of the computer module.

An air mover 220 (e.g., a high output blower or fan) is positioned beneath computer module compartments 218 and is configured to drive a flow of cooling air upwardly through the computer cabinet 210. In other embodiments, however, the air mover 220 and/or other air moving devices can be positioned in other locations in, on, or around the computer cabinet 210, such as above the computer module compartments 218. In yet other embodiments, the air mover 220 or similar devices can be positioned away from the computer cabinet 210.

In one aspect of this embodiment, the computer modules 212e-h in the second computer module compartment 218b are positioned closer together than the computer modules 212a-d in the first computer module compartment 218a, and the computer modules 212 in the third and fourth computer module compartments 218c, d are similarly arranged (i.e., the module-to-module pitch or spacing decreases with each successive computer module compartment). As described in greater detail below, decreasing the module-to-module spacing in this manner reduces the size of the open passages between the individual computer modules 212 and beneficially increases the velocity of cooling air as it flows upwardly through the computer cabinet 210 from the air mover 220. If each of the computer module compartments 218 holds the same number of computer modules 212 (e.g. four), then each successive computer module compartment 218 will be narrower than the computer module compartment 218 positioned directly below it. In the illustrated embodiment, the computer cabinet 210 includes a rear panel 323, a first side panel 272a, and an opposing second side panel 272b that that are configured to accommodate the tiered architecture of the computer module compartments 218. More specifically, the side panels 272 are stepped or tiered inwardly as they proceed upwardly to reduce the air flow bypass area around the outside of the computer modules 212 and further control the direction and/or velocity of the cooling air flowing upwardly through the computer cabinet 210.

In operation, the air mover 220 draws ambient air from the surrounding room into the cabinet 210 via a plurality of air inlets 214 positioned beneath the chassis 230. In the illustrated embodiment, the inlets 214 are formed by gaps between the lower edge portions of the chassis 230 and the floor of the computer facility. In other embodiments, air from a floor plenum can flow into the bottom of the cabinet 210 through an opening in the sub-floor directly beneath the cabinet, or from one or more of other suitable air inlets. The air mover 220 draws the cooling air in through an air mover inlet 222, and drives the air upwardly through and/or around the computer modules 212 positioned in the first computer module compartment 218a. As mentioned above, the computer modules 212 are spaced relatively far apart in the first computer module compartment 218a. After passing through the first computer module compartment 218a, the cooling air proceeds upwardly through the second computer module compartment 218b. As mentioned above, the computer modules 212 in the second computer module compartment 218b are positioned closer together than the computer modules 212 in the first computer module compartment 218a. As a result, the air flow velocity increases as the cooling air moves into the second computer module compartment 218b because of the reduced flow area. The increase in airspeed can compensate for the higher heat content of the cooling air caused by absorbing heat from the electronic devices mounted to the computer modules 212a-d in the first computer module compartment 218a.

From the second computer module compartment 218b, the cooling air continues flowing upwardly through the third computer module compartment 218c, and then through the fourth computer module compartment 218d. As mentioned above, the computer module spacing gets progressively tighter (i.e., it decreases) moving upwardly through the cabinet 210, so that the airspeed also increases to compensate for the higher heat absorption. Once the cooling air has flowed through the fourth computer module compartment 218d, it exits the computer cabinet 210 via a plurality of outlets 224 (identified individually as outlets 224a-d). The upper portion of the computer cabinet 210 can include one or more airflow restrictors 240 (identified individually as airflow restrictors 240a-d), such as perforated plates, that are disposed adjacent to the airflow outlets 224 to further control the flow of cooling air through and out of the computer cabinet 210. One or more of the airflow restrictors 240 can be configured as described in co-pending U.S. patent application Ser. No. 12/060,377, which is incorporated herein in its entirety by reference.

Figure 3:
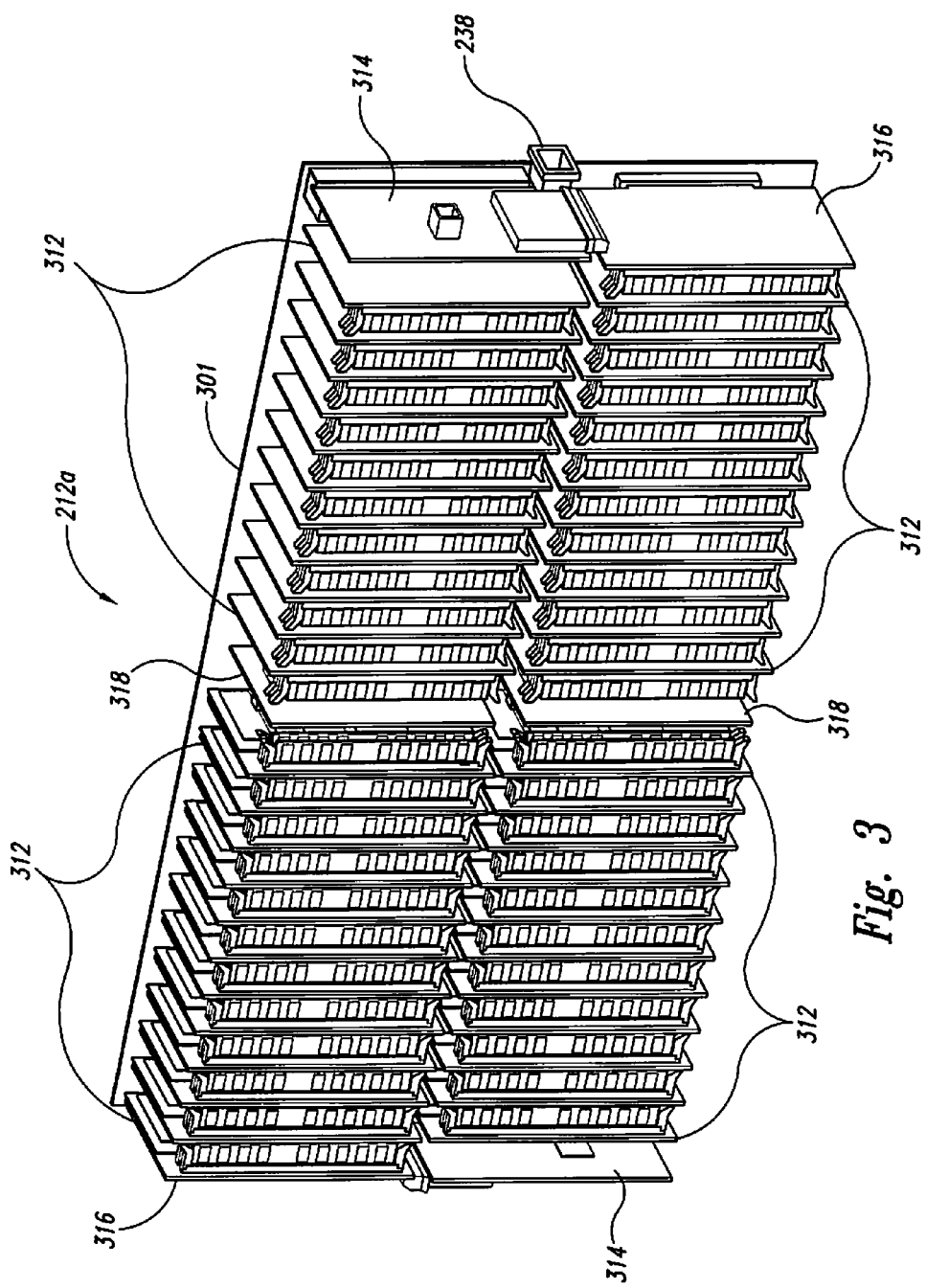
FIG. 3 is an enlarged isometric view of a computer module from the computer cabinet of FIG. 2 configured in accordance with an embodiment of the disclosure.

FIG. 3 is an enlarged isometric view of the first computer module 212a from the computer cabinet 210 of FIG. 2 with the corresponding shroud 270 removed for clarity. Although the first computer module 212a is shown in FIG. 3 and described in greater detail below, the other computer modules 212 can be at least generally similar in structure and function to the first computer module 212a. In one aspect of this embodiment, the computer module 212a includes a main circuit board or motherboard 301 that carries a plurality of smaller circuit boards 312. The smaller circuit boards 312 can be expansion cards, or processor daughtercards, or simply just daughtercards, and will be referred to herein as daughtercards 312 for ease of reference. In the illustrated embodiment, the motherboard 301 carriers 44 daughtercards 312 in two rows of 22 daughtercards each in a side-by-side perpendicular arrangement with respect to the motherboard 301. In addition, a network switch card 314 and a controller card 316 are positioned at each end of the motherboard 301. The power inlet connector 238 is also positioned at one end of the computer module 212, and power cards 318 are positioned on a mid portion of the motherboard 301.

As those of ordinary skill in the art will appreciate, the foregoing description of the computer module 212 is merely representative of one example of a computer module that can be utilized in a progressive velocity computer cabinet configured in accordance with the present disclosure. Accordingly, the present disclosure is not limited to the particular configuration of computer module described above with reference to FIG. 3.

Figure 4:
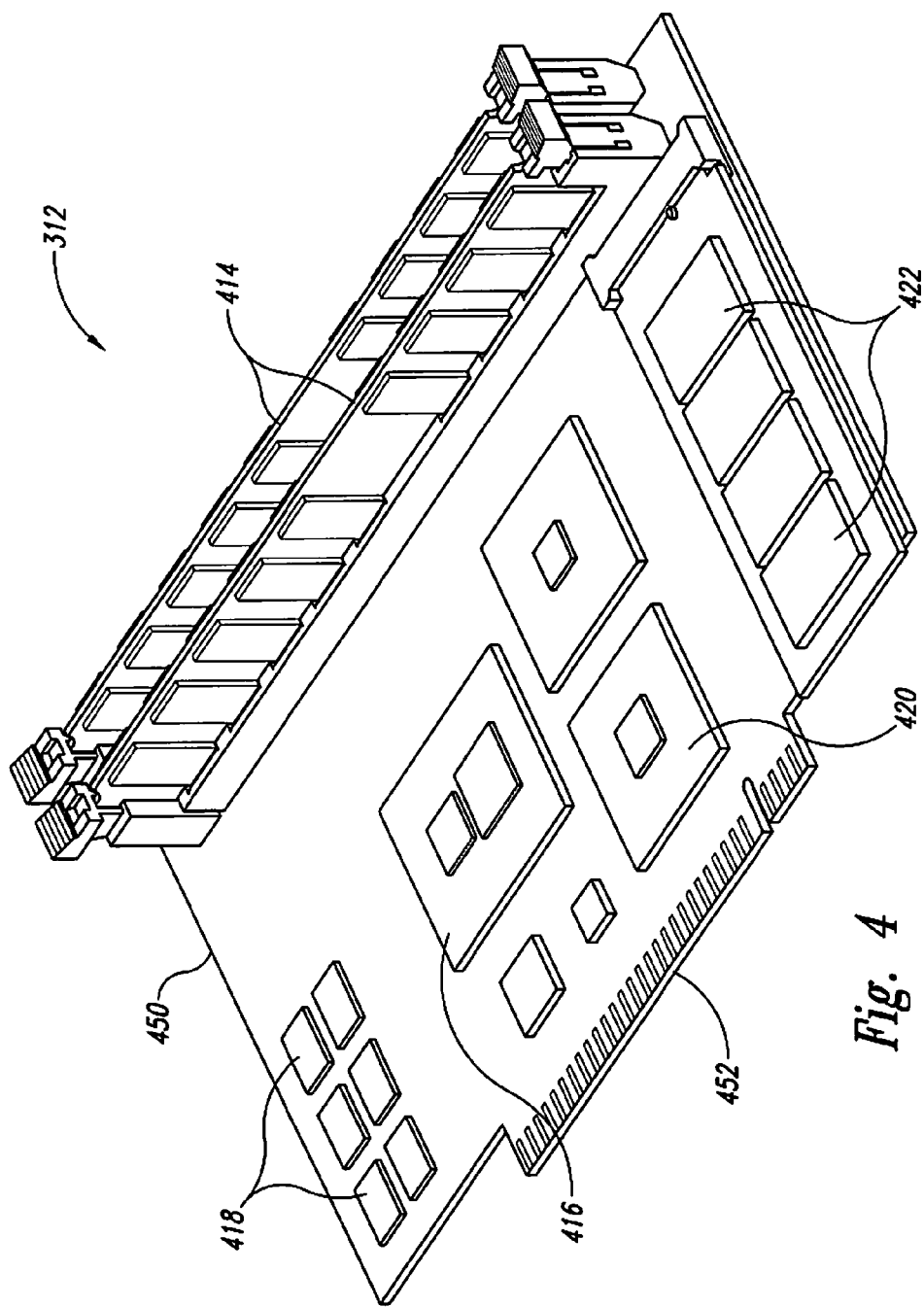
FIG. 4 is an enlarged isometric view of a partially assembled circuit board from the computer module of FIG. 3.

FIG. 4 is an enlarged isometric view of the daughtercard 312. In the illustrated embodiment, the daughtercard 312 includes a mounting substrate or printed circuit board 450 that carries one or more processors 416, voltage regulators 418, a controller 420, and one or more expansion cards 422. The daughtercard 312 can further include one or more (e.g., two) memory modules 414 that are releasably clipped onto the printed circuit board 450 in a generally perpendicular arrangement toward an outer edge portion of the printed circuit board 450. Moreover, the printed circuit board 450 can include an edge connector 452 for releasably connecting the daughtercard 312 to the motherboard 301 as described in greater detail below.

In the illustrated embodiment, all of the daughtercards 312 can be at least generally similar in structure and function to the daughtercard 312 described above with reference to FIG. 4. As those of ordinary skill in the art will appreciate, however, the daughtercard 312 illustrated in FIG. 4 is merely representative of one particular configuration of daughtercard, or expansion card, etc. that can be utilized with computer modules configured in accordance with the present disclosure.

Figure 5A:
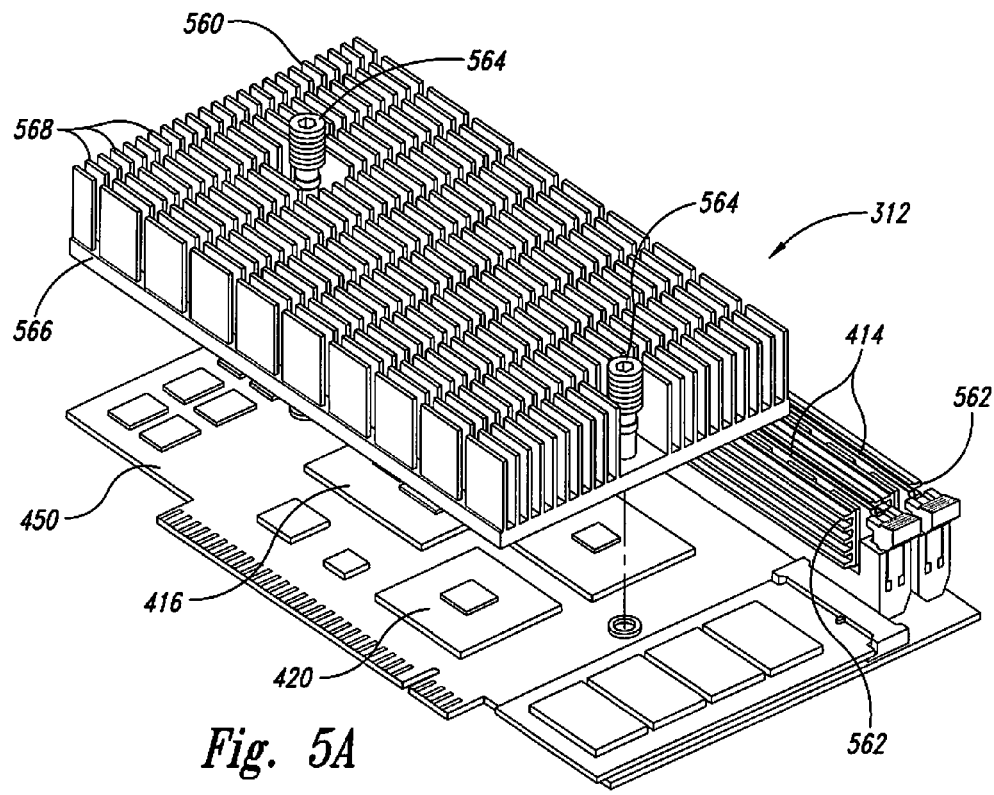
FIG. 5A is a partially exploded isometric view of a heat sink and the circuit board of FIG. 4.
Figure 5B:
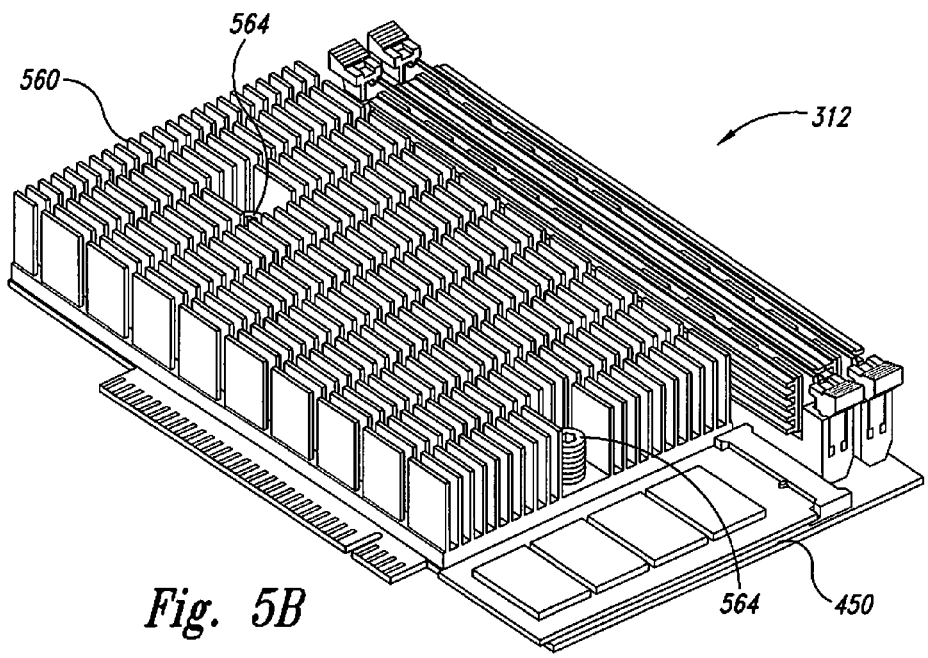
FIG. 5B is an isometric view after the heat sink has been mounted to the circuit board.

FIG. 5A is an exploded isometric view of the daughtercard 312 and a heat sink 560, and FIG. 5B is an isometric view of the daughtercard 312 after the heat sink 560 has been mounted to the motherboard 450. Referring first to FIG. 5A, various types of heat sinks, such as aluminum or other metallic heat sinks having a plurality of cooling fins, can be mounted to the printed circuit board 450 in contact with the processor 416, the controller 420, and/or other electronic components to enhance the cooling of these electronic devices during operation of the computer cabinet 210. In the illustrated embodiment, the heat sink 560 includes a base portion 566 that contacts the electronic components on the printed circuit board 450, and a plurality of coplanar cooling fins 568 extending upwardly therefrom. One or more fasteners 564 (e.g., threaded fasteners extending through corresponding coil springs and/or other biasing devices) can be used to secure the heat sink 560 to the printed circuit board 450 as shown in FIG. 5B. In addition, one or more heat sinks 562, including finned heat sinks, can also be mounted to the memory modules 414 to provide cooling during operation.

Figure 6:
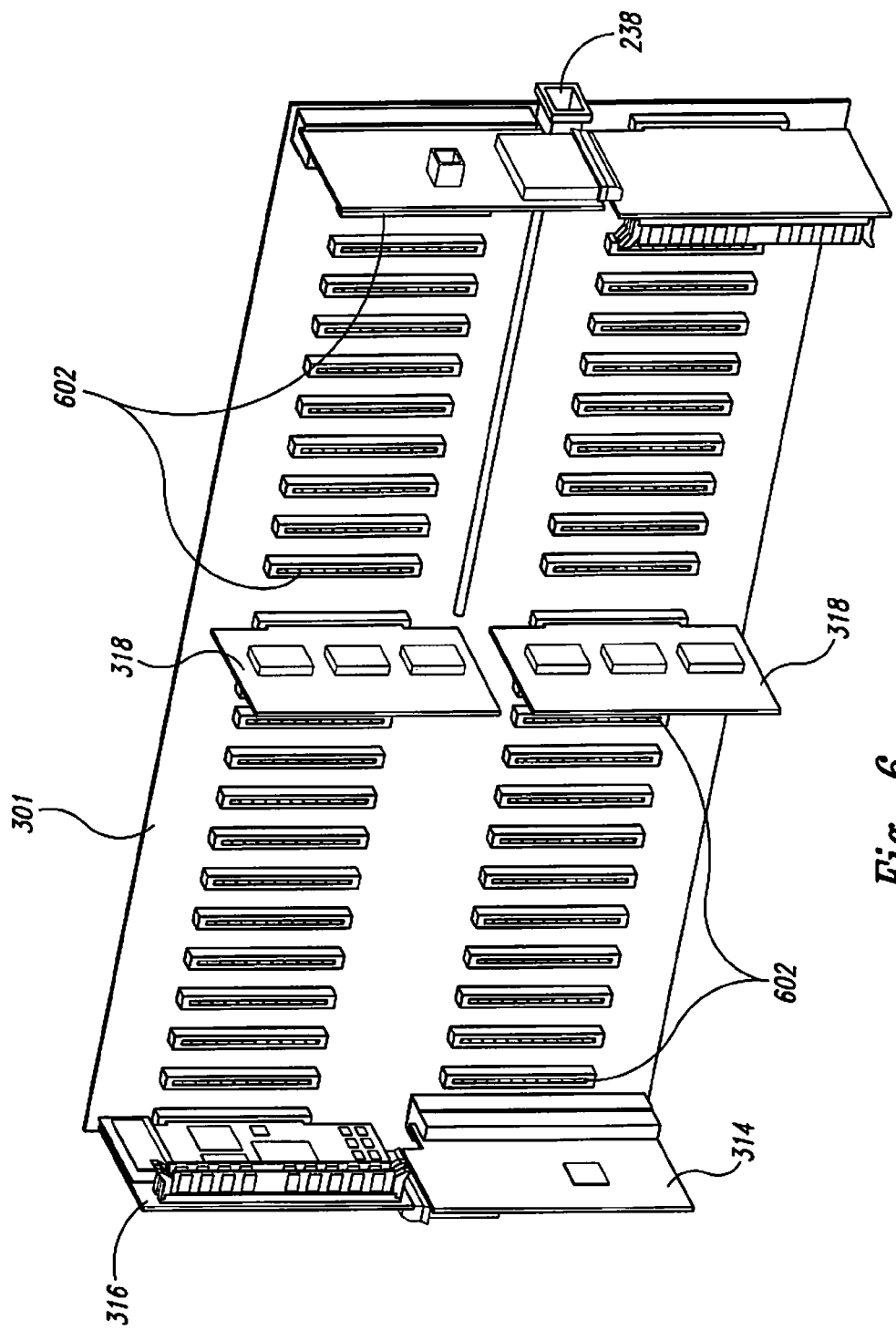
FIG. 6 is an isometric view of a main circuit board from the computer module of FIG. 3 configured in accordance with an embodiment of the disclosure.

FIG. 6 is an isometric view of the motherboard 301 prior to attachment or mounting of the daughtercards 312. As this view illustrates, the motherboard 301 can include a plurality of connectors 602 (e.g., expansion slots) configured to receive the edge connectors 452 of the corresponding daughtercards 312 (FIG. 4). Referring to FIGS. 3-6 together, the edge connectors 452 of each daughtercard 312 can be releasably engaged to a corresponding connector 602 to secure the daughtercards 312 to the motherboard 301 in a generally coplanar orientation. Moreover, the foregoing configuration of the computer module 212 enables the motherboard 301 and the corresponding daughtercards 312 to be positioned in edgewise orientation relative to the upward airflow through the computer cabinet 210 during operation (FIG. 2).

Figure 7:
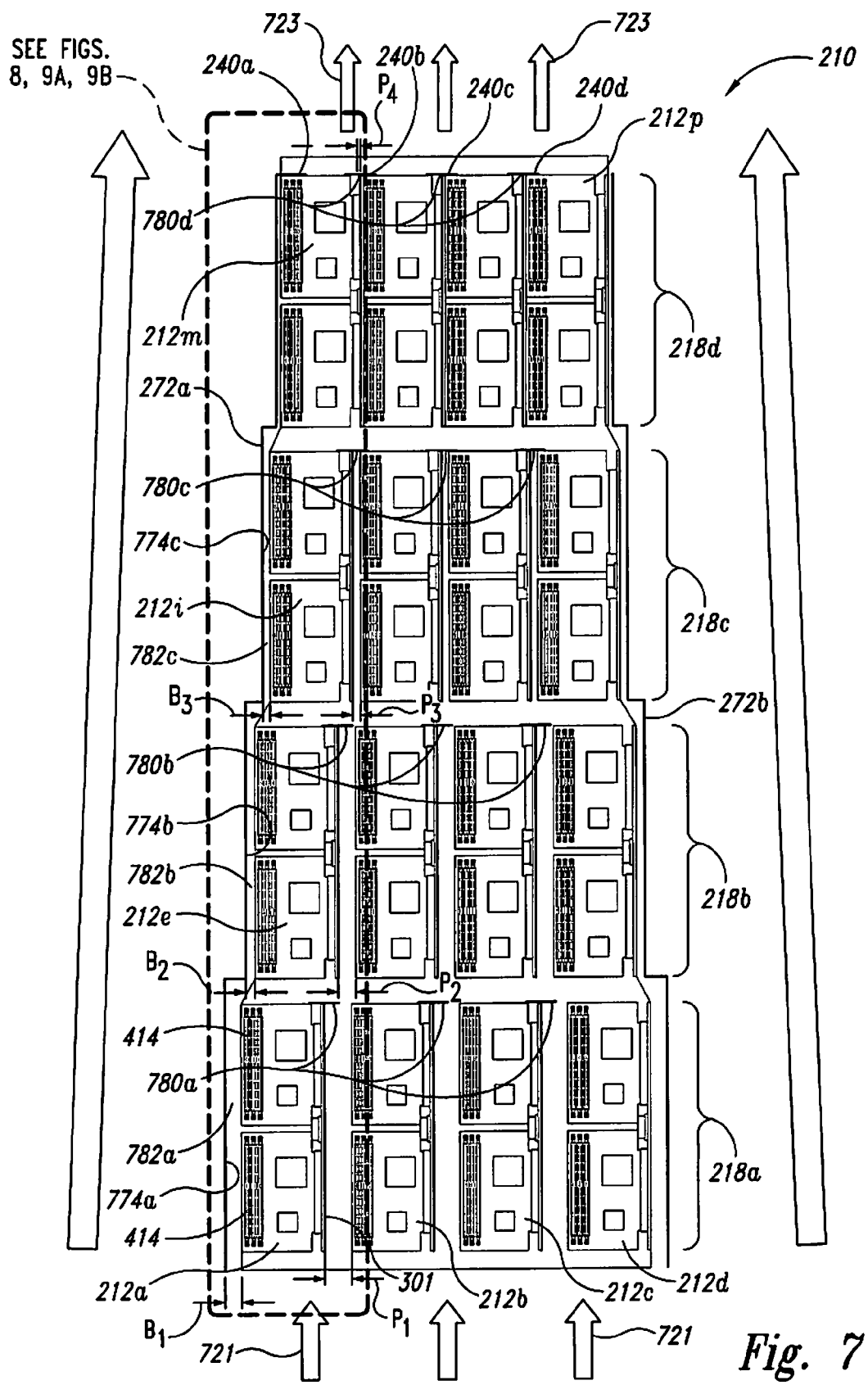
FIG. 7 is a schematic front elevation view of the computer cabinet of FIG. 2, illustrating a tiered computer module arrangement configured in accordance with an embodiment of the disclosure.

FIG. 7 is a schematic front elevation view of the computer cabinet 210 configured in accordance with an embodiment of the disclosure. The cooling air flowing into the first computer module 218a from the air mover 220 (FIG. 2) is indicated by the arrows 721, and the cooling air exhausting from the top portion of the computer cabinet 210 is indicated by the arrows 723. As this view illustrates, the spacing between the computer modules 212 is reduced with each successive computer module compartment 218. As a result, after the first computer module compartment 218a, each of the subsequent computer module compartments 218 is narrower than the computer module compartment positioned directly below it, resulting in a tiered arrangement. More specifically, in the illustrated embodiment the computer modules 212 in the first computer module compartment 218a are spaced apart by a first module spacing or pitch $P_1$ that is greater than a second pitch $P_2$ between the computer modules 212 in the second computer module compartment 218b. Similarly, the second pitch $P_2$ is greater than a third spacing or pitch $P_3$ between the computer modules 212 in the third computer module compartment 218c, which is greater than a fourth pitch $P_4$ between the computer modules 212 in the fourth computer module compartment 218d.

In another aspect of this embodiment, each of the side panels 272 includes a first sidewall portion 774a, a second sidewall portion 774b, and a third sidewall portion 774c. In the illustrated embodiment, the first sidewall portion 774a is spaced apart from the first computer module 212a by a first bypass distance $B_1$ to form a first open passage or bypass lane 782a. The second sidewall portion 774b is similarly spaced apart or offset from the fifth computer module 212e by a second bypass distance $B_2$ to form a second bypass lane 782b, and the third sidewall portion 774c is offset from the ninth computer module 212i by a third bypass distance $B_3$ to form a third bypass lane 782c. In the illustrated embodiment, the bypass distances B decrease for each successive computer module compartment 218 so that the first bypass distance $B_1$ is greater than the second bypass distance $B_2$, which is greater than the third bypass distance $B_3$. As with the module pitch P, reducing the bypass distance B in the foregoing manner further reduces the amount of open cross-sectional area in the bypass lanes 782 through which cooling air can flow as it moves upwardly through the computer cabinet 210. The reduced flow area causes the cooling air to accelerate through the upper computer module compartments 218, which maintains the cooling capacity of the air in spite of the increased air temperature caused by absorbing heat from the computer modules 212 in the lower computer module compartments 218.

In a further aspect of this embodiment, the computer cabinet 210 can include one or more flow restrictors 780 extending at least partially between the computer modules 212 to restrict or otherwise control the airflow upwardly between the computer modules 212. For example, in the illustrated embodiment, the first computer module compartment 218a can include a first flow restrictor 780a extending outwardly from an upper portion of the motherboard 301 of the first computer module 212a toward the adjacent memory modules 414 of the second computer module 212b. The first flow restrictor 780a can extend part of the distance between first and second computer modules 212a, b, thereby leaving a relatively small gap between the upper portions of the computer modules 212 though which cooling air can flow. Each of the second and third computer modules 212b, c can also include a corresponding flow restrictor 780a as shown in FIG. 7. The second computer module compartment 218b, the third computer module compartment 218c, and the fourth computer module compartment 218d can also include similar flow restrictors 780b, c, and d, respectively, extending at least partially across the gaps between the upper portions of the computer modules 212. Moreover, as mentioned above, the computer cabinet 210 can also include one or more of the flow restrictors 240 positioned toward a top portion of the computer cabinet 210 in line with, for example, the memory modules 414 to further direct the flow of cooling air away from the memory modules and through the heat sinks associated with the processing devices on the corresponding daughtercards 312 (FIGS. 5A and 5B).

Figure 8:
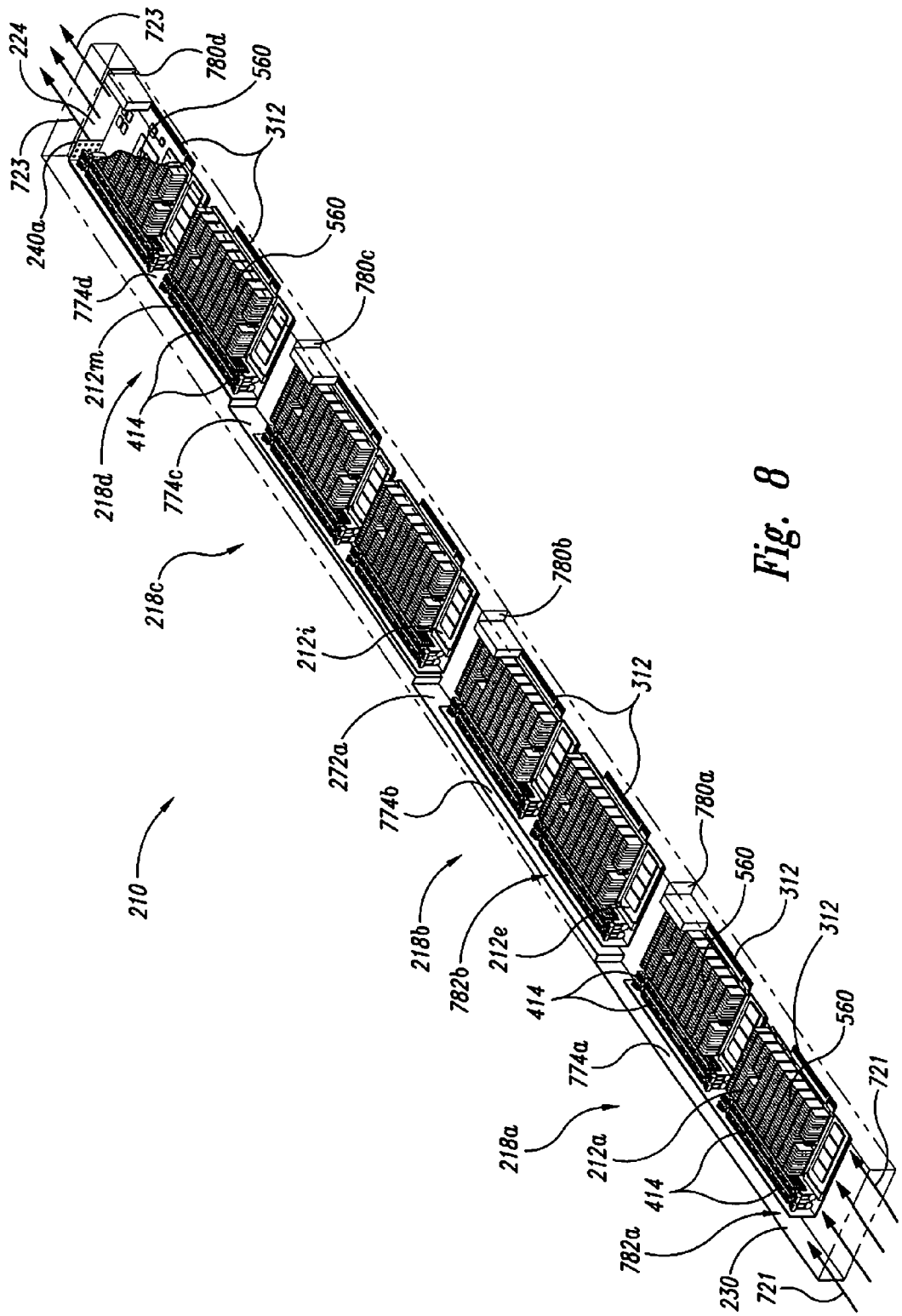
FIG. 8 is an enlarged isometric view taken from FIG. 7, illustrating a vertical arrangement of circuit boards configured in accordance with an embodiment of the disclosure.

FIG. 8 is an isometric view of a "slice" or column of daughtercards 312 taken from FIG. 7. In this view, the motherboards 301 which support the corresponding daughtercards 312 and have been omitted for purposes of clarity and illustration. As the flow of cooling air indicated by the arrows 721 flows upwardly into the first computer module compartment 218a, a portion of the air bypasses the first set of daughtercards 312 by flowing through the open first bypass lane 782a between the first sidewall portion 774a and the column of memory modules 414 (e.g., the "memory lane"). As FIG. 8 illustrates, however, the bypass distances B (FIG. 7) between the sidewall portions 774 and the memory lane 414 decrease as the airflow moves upwardly through the computer cabinet 210. As a result, the flow of bypass air progressively decreases and more of the cooling air is directed through the memory modules 414 and the heat sinks 560 on the daughtercards 312, before exiting the computer cabinet through the outlet 224 as indicated by the arrows 723.

Figure 9A:
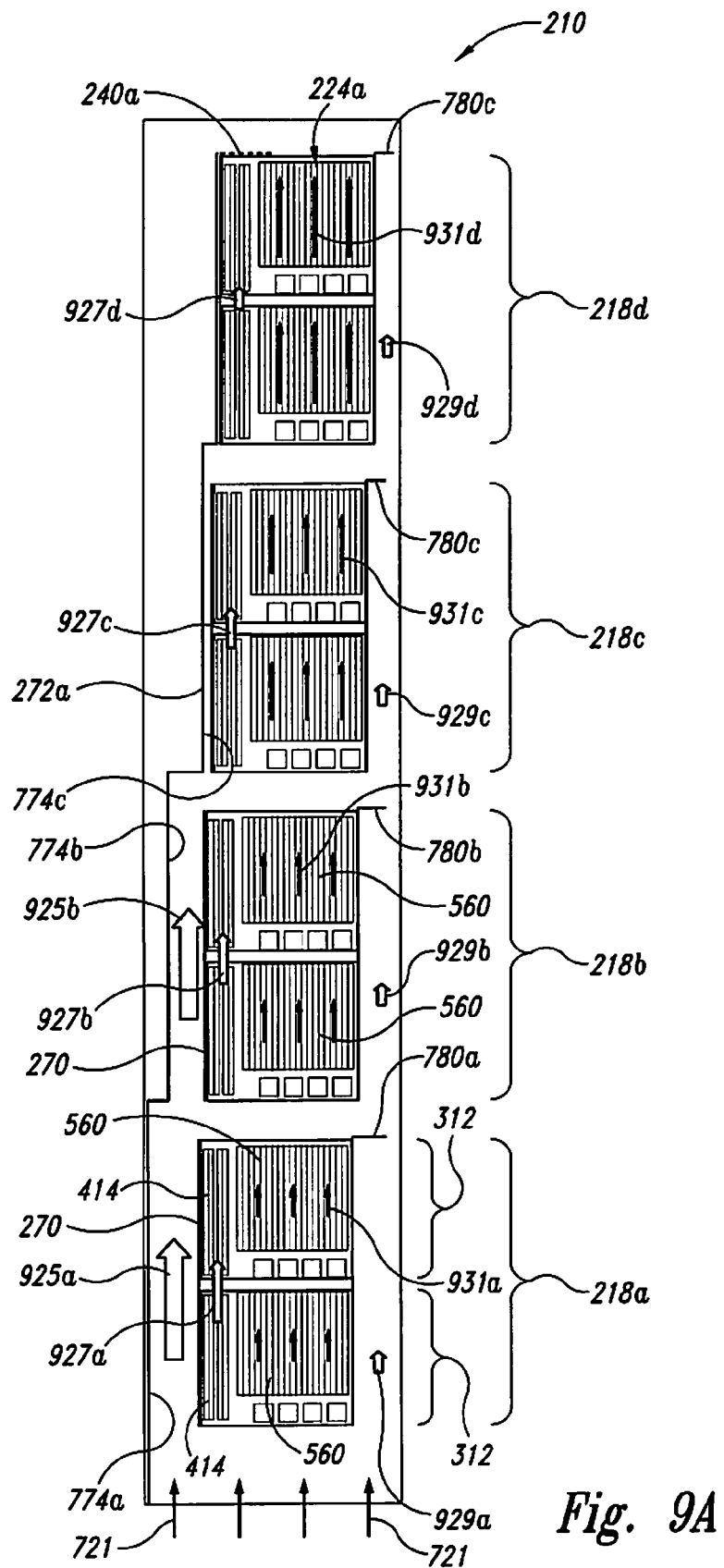
FIGS. 9A and 9B are schematic diagrams illustrating representative airflows associated with the circuit board arrangement of FIG. 8 in accordance with an embodiment of the disclosure.
Figure 9B:
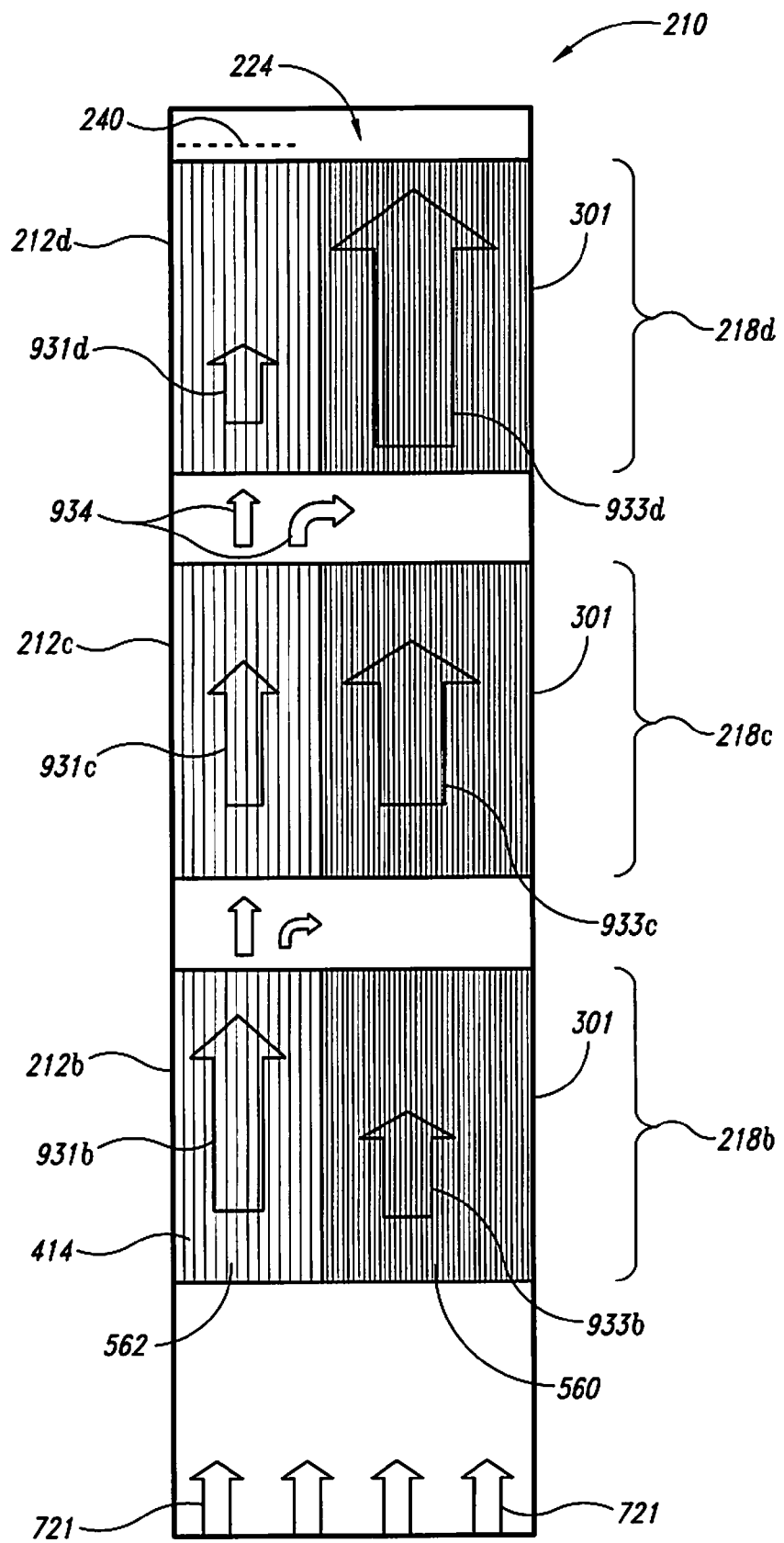

FIGS. 9A and 9B are schematic diagrams illustrating the relative volume and speed of the airflow through the computer cabinet 210 in accordance with an embodiment of the disclosure. Referring first to FIG. 9A, the volume of air bypassing each of the computer modules 212, as identified by the arrows 925a and b, decreases as the airflow moves upwardly through the computer cabinet 210. In addition, the flow of cooling air bypassing the memory modules 414 along the memory lane, as indicated by the arrows 927a-c, also decreases moving upwardly through the computer cabinet 210, as does the processor bypass as indicated by the arrows 929. In contrast, both the volume and speed of cooling air flowing between the individual daugtercards 312 (FIG. 8), as indicated by arrows 931, increases with each successive computer module compartment 218.

Referring next to FIG. 9B, the velocity of the airflow flowing through the heat sinks 562 on the memory modules 414, as indicated by the arrows 931b-d, decreases as the airflow moves upwardly through the computer cabinet 210. Conversely, as shown by the arrows 933b-d, the velocity of the airflow through the heat sinks 560 on the processing devices and other electronic devices on the daughtercards 212 increases as the airflow moves upwardly through the computer cabinet 210 and absorbs more heat. The decrease in flow speed of the airflow moving through the heat sinks 562 on the memory modules 414 is restricted and slowed by means of the flow restrictor 240 positioned at an upper portion of the computer cabinet 210.

One advantage of some of the embodiments of the systems and methods described herein is that all, or at least a portion of the computer modules 212 can be identical, or at least generally similar in structure and function because the bypass lanes 782 and/or the air flow restrictors 240 are formed by the cabinet 210, and are not part of the individual modules 212. This can lead to lower manufacturing and operating costs. In other embodiments, one or more of the computer modules 212 may be different and/or may include a portion of the bypass lanes 782 and/or the air flow restrictors 240.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

I claim:

1. A computer system comprising:
   a computer cabinet;
   a first computer module compartment positioned in the computer cabinet;
   a second computer module compartment positioned in the computer cabinet and spaced apart from the first computer module compartment;
   a first plurality of computer modules carried in the first computer module compartment, wherein the first plurality of computer modules includes at least a first computer module spaced apart from a second computer module by a first distance to define a first open passageway therebetween;
   a second plurality of computer modules carried in the second computer module compartment, wherein the second plurality of computer modules includes at least a third computer module spaced apart from a fourth computer module by a second distance that is less than the first distance to define a second open passageway therebetween, wherein the first computer module compartment is spaced apart from the second computer module compartment in a first direction, and wherein the first, second, third, and fourth computer modules are aligned in edgewise orientation relative to the first direction; and an air mover positioned to move a flow of cooling air through the first open passageway in the first computer module compartment and the second open passageway in the second computer module compartment.

2. The computer system of claim 1 wherein the first open passageway has a first cross-sectional flow area, and the second open passageway has a second cross-sectional flow area that is less than the first cross-sectional flow area.

3. The computer system of claim 2 wherein the first, second, third, and fourth computer modules individually carry at least one processing device and at least one memory device.

4. A computer system comprising:
a computer cabinet;
a first computer module compartment positioned in the computer cabinet;
a second computer module compartment positioned in the computer cabinet and spaced apart from the first computer module compartment;
a first plurality of computer modules carried in the first computer module compartment, wherein the first plurality of computer modules includes at least a first computer module spaced apart from a second computer module by a first distance to define a first open passageway therebetween, the first open passageway having a first cross-sectional flow area;
a second plurality of computer modules carried in the second computer module compartment, wherein the first plurality of computer modules are spaced apart from each other by a first module pitch, and the second plurality of computer modules are spaced apart from each other by a second module pitch that is less than the first module pitch, wherein the second plurality of computer modules includes at least a third computer module spaced apart from a fourth computer module by a second distance that is less than the first distance to define a second open passageway therebetween, the second open passageway having a second cross-sectional flow area that is less than the first cross-sectional flow area; and
an air mover positioned to move a flow of cooling air through the first open passageway in the first computer module compartment and the second open passageway in the second computer module compartment.

5. A computer system comprising:
a computer cabinet;
a first computer module compartment positioned in the computer cabinet;
a second computer module compartment positioned in the computer cabinet and spaced apart from the first computer module compartment;
a first plurality of computer modules carried in the first computer module compartment, wherein the first plurality of computer modules includes at least a first computer module spaced apart from a second computer module by a first distance to define a first open passageway therebetween, the first open passageway having a first cross-sectional flow area;
a second plurality of computer modules carried in the second computer module compartment, wherein the second plurality of computer modules includes at least a third computer module spaced apart from a fourth computer module by a second distance that is less than the first distance to define a second open passageway therebetween, the second open passageway having a second cross-sectional flow area that is less than the first cross-sectional flow area, wherein the first computer module compartment is spaced apart from the second computer module compartment in a first direction, wherein the first computer module is spaced apart from the second computer module in a second direction that is at least approximately perpendicular to the first direction, and wherein the third computer module is spaced apart from the fourth computer module in the second direction; and
an air mover positioned to move a flow of cooling air through the first open passageway in the first computer module compartment and the second open passageway in the second computer module compartment.

6. The computer system of claim 5 wherein the first computer module includes a first printed circuit board, the second computer module includes a second printed circuit board, the third computer module includes a third printed circuit board, and the fourth computer module includes a fourth printed circuit board, and wherein the first, second, third, and fourth printed circuit boards are parallel to the first direction.

7. A computer system comprising:
a computer cabinet;
a first computer module compartment positioned in the computer cabinet;
a second computer module compartment positioned in the computer cabinet and spaced apart from the first computer module compartment;
a first plurality of computer modules carried in the first computer module compartment, wherein the first plurality of computer modules includes at least a first computer module spaced apart from a second computer module by a first distance to define a first open passageway therebetween;
a second plurality of computer modules carried in the second computer module compartment, wherein the second plurality of computer modules includes at least a third computer module spaced apart from a fourth computer module by a second distance that is less than the first distance to define a second open passageway therebetween;
a shroud assembly positioned around at least a portion of the first and second computer module compartments in the cabinet, the shroud assembly having a first sidewall portion and a second sidewall portion, wherein the first sidewall portion is spaced apart from the first computer module by a third distance to define a third open passageway therebetween, wherein the second sidewall portion is spaced apart from the third computer module by a fourth distance that is less than the third distance to define a fourth open passageway therebetween; and
an air mover positioned to move a first flow of cooling air through the first open passageway in the first computer module compartment and the second open passageway in the second computer module compartment, and move a second flow of cooling air through the third and fourth open passageways.

8. A computer system comprising:
a computer cabinet;
a first computer module compartment positioned in the computer cabinet;
a second computer module compartment positioned in the computer cabinet and spaced apart from the first computer module compartment;

a first plurality of computer modules carried in the first computer module compartment, wherein the first plurality of computer modules includes at least a first computer module spaced apart from a second computer module by a first distance to define a first open passageway therebetween;

a second plurality of computer modules carried in the second computer module compartment, wherein the second plurality of computer modules includes at least a third computer module spaced apart from a fourth computer module by a second distance that is less than the first distance to define a second open passageway therebetween;

a third computer module compartment positioned in the computer cabinet and spaced apart from the second computer module compartment, wherein the second computer module compartment is positioned between the first computer module compartment and the third computer module compartment;

a third plurality of computer modules carried in the third computer module compartment, wherein the third plurality of computer modules includes at least a fifth computer module spaced apart from a sixth computer module by a third distance that is less than the second distance to define a third open passageway therebetween; and an air mover positioned to move a flow of cooling air through the first open passageway in the first computer module compartment, the second open passageway in the second computer module compartment, and the third open passageway in the third computer module compartment.

9. The computer system of claim 8, further comprising:

a shroud assembly positioned around at least a portion of the first, second, and third computer module compartments in the cabinet, the shroud assembly having a first sidewall portion spaced apart from the first computer module by a fourth distance to define a fourth open passageway therebetween, a second sidewall portion spaced apart from the third computer module by a fifth distance that is less than the fourth distance to define a fifth open passageway therebetween, and a third sidewall portion spaced apart from the fifth computer module by a sixth distance that is less than the fifth distance to define a sixth open passageway therebetween, wherein the air mover is further configured to move a flow of cooling air through the fourth open passageway in the first computer module compartment, the fifth open passageway in the second computer module compartment, and the sixth open passageway in the third computer module compartment.

* * * * *

UNITED STATES PATENT AND TRADEMARK OFFICE
CERTIFICATE OF CORRECTION

| | | |
|---|---|---|
| PATENT NO. | : 8,472,181 B2 | Page 1 of 1 |
| APPLICATION NO. | : 12/763977 | |
| DATED | : June 25, 2013 | |
| INVENTOR(S) | : Wade J. Doll | |

It is certified that error appears in the above-identified patent and that said Letters Patent is hereby corrected as shown below:

In the Specification:

In column 4, line 32, delete "that that" and insert -- that --, therefor.

In column 8, line 13, delete "daugtercards" and insert -- daughtercards --, therefor.

Signed and Sealed this
Nineteenth Day of November, 2013

Teresa Stanek Rea
*Deputy Director of the United States Patent and Trademark Office*